(12) United States Patent
Toya

(10) Patent No.: US 6,692,221 B2
(45) Date of Patent: Feb. 17, 2004

(54) METHOD OF ADHERING WAFER AND WAFER ADHERING DEVICE

(75) Inventor: Tetsuro Toya, Nagano (JP)

(73) Assignee: Fujikoshi Machinery Corp., Nagano (JP)

( * ) Notice: Subject to any disclaimer, the term of this patent is extended or adjusted under 35 U.S.C. 154(b) by 145 days.

(21) Appl. No.: 10/038,262

(22) Filed: Jan. 3, 2002

(65) Prior Publication Data

US 2002/0090589 A1 Jul. 11, 2002

(30) Foreign Application Priority Data

Jan. 9, 2001 (JP) ........................................ 2001-001275

(51) Int. Cl.⁷ .............................................. H01L 21/68
(52) U.S. Cl. ................................... 414/936; 198/341.05
(58) Field of Search ............................. 414/935, 936; 198/341.05, 345.3, 346.2, 414; 438/959

(56) References Cited

U.S. PATENT DOCUMENTS 4,534,695 A * 8/1985 Stump et al. ............... 219/386
4,856,641 A * 8/1989 Matsumura et al. ...... 198/346.2
5,961,722 A * 10/1999 Buhrer et al. ................ 118/712
5,982,132 A * 11/1999 Colby ......................... 318/649
6,346,033 B1 * 2/2002 Lamprecht et al. ............ 451/57

FOREIGN PATENT DOCUMENTS

JP        2562044        8/1996
JP       11-320393      11/1999

* cited by examiner

Primary Examiner—Christopher P. Ellis
Assistant Examiner—Mark A. Deuble
(74) Attorney, Agent, or Firm—Jordan and Hamburg LLP

(57) ABSTRACT

The method of the present invention is capable of adhering a wafer to a prescribed position of the carrier plate, which has been correctly positioned, in a short time. The method comprises the steps of: heating a carrier plate; detecting a mark provided to a predetermined position of the carrier plate rotating at predetermined rotational speed; positioning the carrier plate on the basis of a position of the detected mark; conveying the carrier plate to a wafer adhering section with keeping a posture of the carrier plate which has been positioned in the positioning step; and adhering the wafer at a prescribed position of the carrier plate.

6 Claims, 6 Drawing Sheets

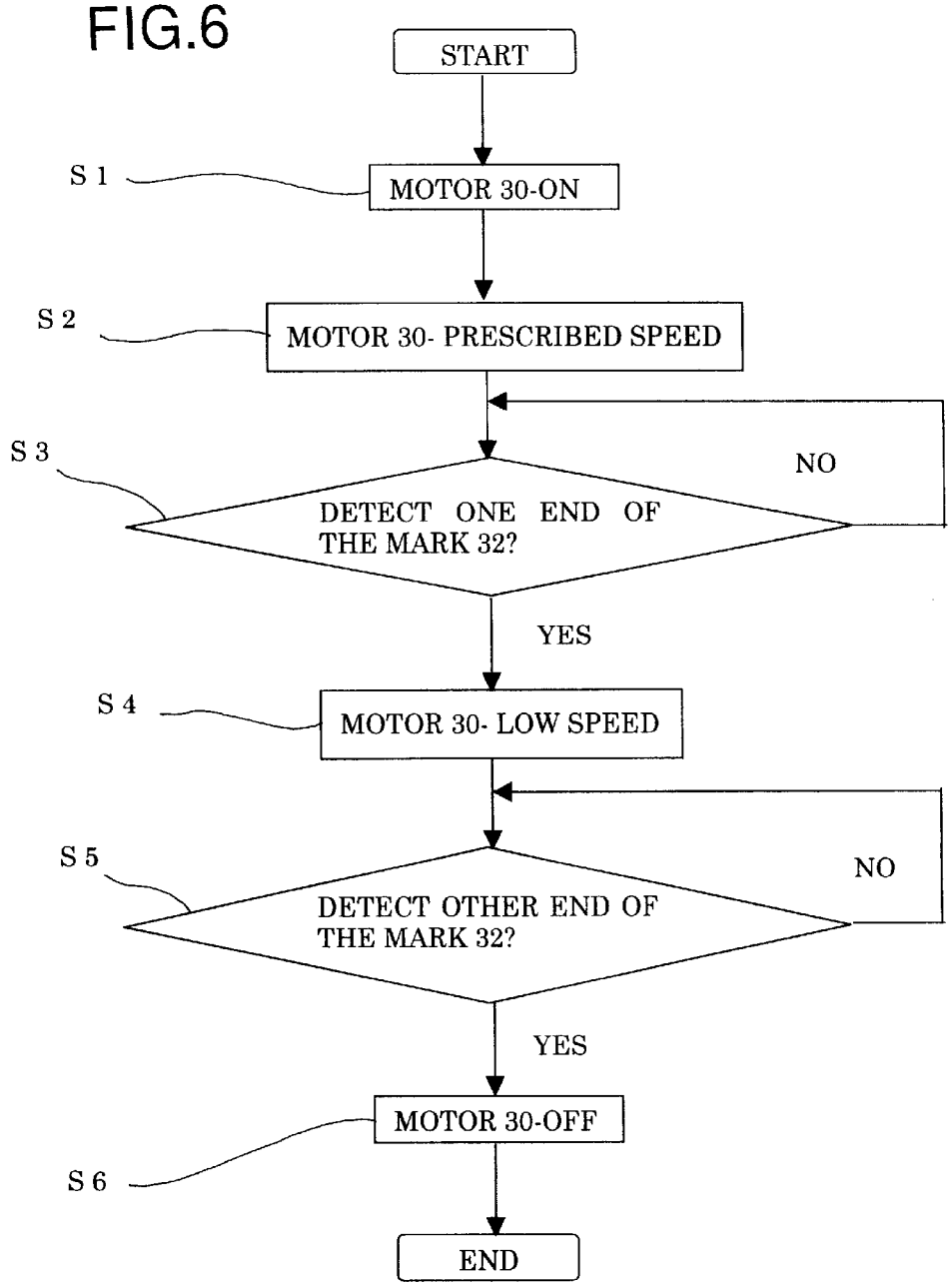

METHOD OF ADHERING WAFER AND WAFER ADHERING DEVICE

BACKGROUND OF THE INVENTION

The present invention relates to a method of adhering a wafer and a wafer adhering device, more precisely relates to a method of adhering a wafer onto a preheated carrier plate before abrading the wafer and a wafer adhering device for executing said method.

Generally, in the case of abrading or polishing a wafer, one side face of the wafer is adhered onto a flat face of a tough carrier plate, and the other side wafer held by the carrier plate is abraded or polished.

Wafers are thin and apt to warp, so it is difficult to maintain wafers flat. But flatness of the wafers adhered can be maintained by the tough carrier plate, so that the wafers can be abraded easily.

To abrade or polish the faces of the wafers with high flatness, the wafers must be precisely adhered onto the carrier plate, and flatness of the carrier plate must be high.

Especially, in the case of polishing silicon wafers, a plurality of silicon wafers are adhered onto the carrier plate and pressed onto a polishing plate together with the carrier plate. The silicon wafers and the polishing plate are relatively moved to polish the silicon wafers. These days, flatness of the polished silicon wafers is very high, e.g., submicron order.

The polished silicon wafers are peeled from the carrier plate and conveyed to the next process; the carrier plate from which the silicon wafers have been peeled are cleaned and reused.

Therefore, the carrier plate is made of a material having high toughness and durability, e.g., ceramic.

Generally, the wafers are adhered onto the carrier plate by an adhesive, e.g., wax. The wax is dropped onto the wafer, then the wafer is spun so as to extend the wax, so that the whole surface of the wafer can be uniformly covered with the wax. Successively, the wafer is inverted and adhered onto the carrier plate, which has been preheated.

Surface condition of the surface of the cleaned carrier plate, on which the wafers are adhered, is partially minutely different. Namely, surface condition of one part, on which the wafer was adhered, is minutely different from that of another part, on which no wafer was adhered. For example, abrasive grains included in slurry, abraded dusts, etc. deposit on the part, on which no wafer was adhered, and said part is badly influenced by chemical substances included in the slurry.

On the other hand, no abrasive grains, etc. deposit on the part, on which the wafer was adhered, and said part is scarcely influenced by the chemical substances.

If the wafers are adhered onto the carrier plate without considering the minute differences of the surface of the carrier plate, some wafers bridge the two parts. If the wafer is accidentally adhered to bridge the two parts, the polishing work is badly influenced by the minute differences, so that the flatness of the polished wafer is made lower.

To solve the above described problem, a wafer adhering device capable of repeatedly adhering wafers at same places of a carrier plate was proposed (see Japanese Utility Model Gazette No. 2,562,044). The wafer adhering device is shown in FIG. 7.

In FIG. 7, the wafer adhering device 100 has an adhering table 102, which is capable of rotating in a direction "A". A carrier plate 104 is mounted on the adhering table 102 and has marks 106. Sensors for detecting the marks 106 are provided. A sucking section 110 is vertically moved. A mounting unit mounts a wafer 108 held by the sucking section 110 on a prescribed position of an adhesion face 104a of the carrier plate 104.

In the wafer adhering device 100, firstly the carrier plate 104 is positioned on the basis of the positions of the marks 106 detected by the sensors, then the adhering table 102 is rotated until a prescribed position of the carrier plate 104, at which the wafer 108 was adhered for a previous adhering work, reaches a position under the sucking section 110. The rotation of the adhering table 102 is stopped when the prescribed position of the carrier plate 104, at which the wafer 108 was adhered for the previous adhering work, reaches the position under the sucking section 110. Then, the sucking section 110 is moved downward so as to mount the wafer 108 at the prescribed position, at which the wafer 108 was adhered for the previous adhering work.

Further, a method of periodically changing positions of adhering wafers in a carrier plate on the basis of detected marks was disclosed in Japanese Patent Gazette No. 11-320393.

In the method disclosed in the Japanese Patent Gazette, a whole surface of the carrier plate can be uniformly used to adhere the wafers, so that surface conditions of the carrier plate can be uniform and the wafers can be adhered under uniform condition.

In the device and method disclosed in said Japanese Gazettes, flatness of the abraded wafers can be improved. However, the position of the carrier plate is defined at the adhering table, on which the wafers are adhered. Required time for positioning the carrier plate is longer than that for adhering wafers onto the carrier plate, so that it takes a long time to position the carrier plate and adhere the wafers thereonto.

SUMMARY OF THE INVENTION

An object of the present invention is to provided a method capable of adhering a wafer to a prescribed position of the carrier plate, which has been correctly positioned, in a short time.

Another object is to provide a device for executing said method.

To shorten the time for adhering the wafers at an adhering table, the inventor proposed to separately execute the step of positioning the carrier plate and the step of mounting the wafers onto the carrier plate. Further, he proposed to position the carrier plate while the carrier plate is preheated.

Namely, the method of the present invention comprises the steps of:
  heating a carrier plate;
  detecting a mark provided to a predetermined position of the carrier plate rotating at predetermined rotational speed;
  positioning the carrier plate on the basis of a position of the detected mark;
  conveying the carrier plate to a wafer adhering section with keeping a posture of the carrier plate which has been positioned in the positioning step; and
  adhering the wafer at a prescribed position of the carrier plate.

Further, the wafer adhering device of the present invention, which adheres a wafer heated at a heating section to a carrier plate, comprises:

means for detecting a mark provided to a predetermined position of the carrier plate rotating at predetermined rotational speed;

means for positioning the carrier plate on the basis of a position of the detected mark;

means for conveying the carrier plate to a wafer adhering section with keeping a posture of the carrier plate which has been positioned in the positioning step; and means for mounting the wafer at a prescribed position of the carrier plate which has been conveyed to an adhering table.

In the present invention, positioning the carrier plate and mounting the wafer are separately executed, and positioning the carrier plate is executed in the step of heating the carrier plate, whose required time is shorter than other steps. Therefore, mounting the wafer, whose required time is shorter than that of positioning the carrier plate, can be executed at the adhering table. Unlike the conventional technology in which positioning the carrier plate and mounting the wafer are executed at the adhering table, the present invention is capable of shortening the required time of mounting the wafer. Therefore, time of a preparation step can be shortened, so that total time of abrading the wafer can be shortened.

In the present invention, the mark may be a wide mark, rotational speed of the carrier plate may be made slower than the predetermined rotational speed when one end of the mark is detected, and rotation of the carrier plate may be stopped when the other end of the mark is detected. In this case, movement of the carrier plate, which is occurred after the rotation of the carrier plate is stopped, can be prevent, so that positioning accuracy of the carrier plate can be improved.

Further, in the present invention, the mark may be detected by a sensor provided to a heating table for heating the carrier plate. In this case, the carrier plate can be correctly positioned easily.

BRIEF DESCRIPTION OF THE DRAWINGS

Embodiments of the present invention will now be described by way of examples and with reference to the accompanying drawings, in which:

FIG. 6 is a flow chart explaining another method of the present invention; and

DETAILED DESCRIPTION OF THE PREFERRED EMBODIMENTS

Preferred embodiments of the present invention will now be described in detail with reference to the accompanying drawings.

Figure 1:
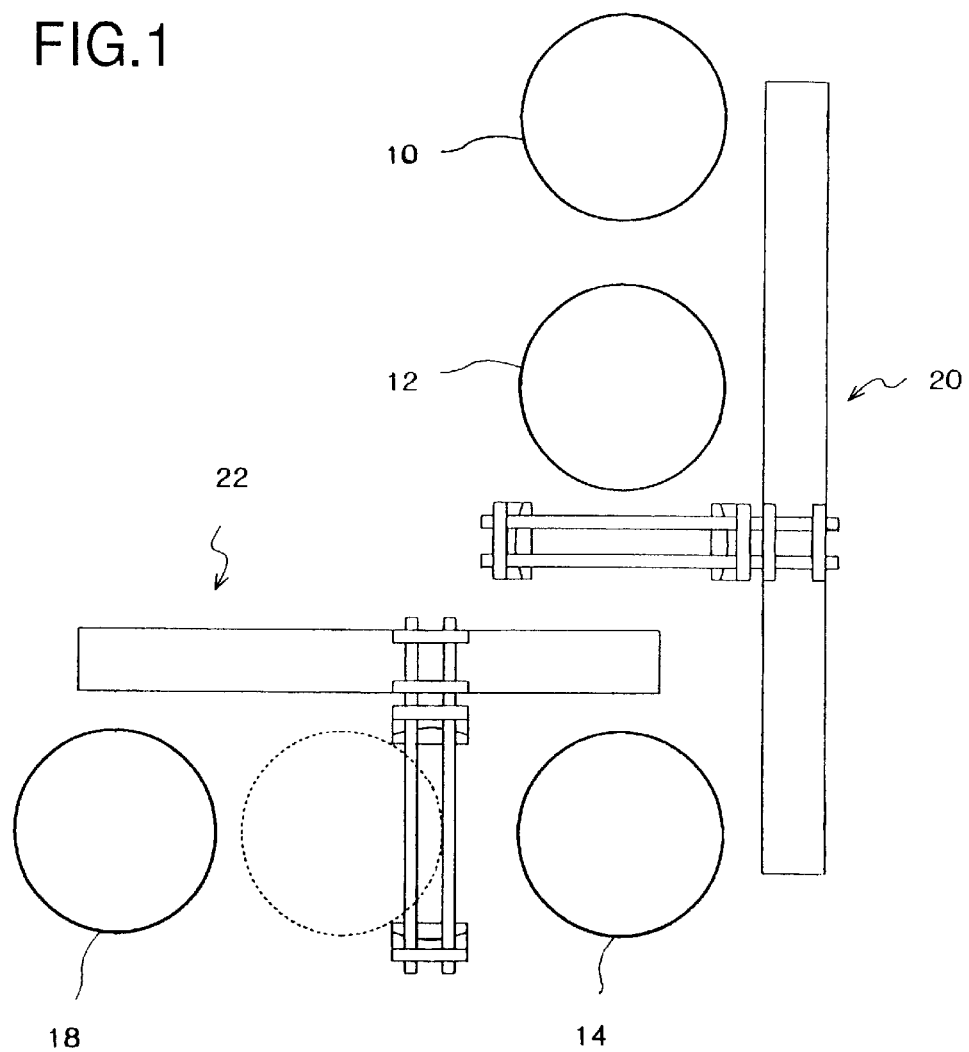
FIG. 1 is a schematic view of a wafer adhering device relating to the present invention.

A schematic view of a wafer adhering device of an embodiment of the present invention is shown in FIG. 1. A preheating section, which includes a first preheating table 10 and a second preheating table 12 which respectively preheat a carrier plate made of a ceramic, and a wafer adhering section, which includes an adhering table 14, are serially arranged. A press section, which includes a press table 18, is arranged perpendicular to the line connecting the preheating section and the wafer adhering section.

The carrier plate is conveyed to the first preheating table 10, the second preheating table 12, the adhering table 14 and the press table 18 in this order. A conveyor unit 20 conveys the carrier plate to the first preheating table 10, the second preheating table 12 and the adhering table 14; a conveyor unit 22 conveys the carrier plate from the adhering table 14 to the press table 18. Therefore, the conveyor units 20 and 22 are arranged in an L-shape.

Temperature of the second preheating table 12 is higher than that of the first preheating table 10. Namely, the carrier plate is heated in two stages, and wafers are adhered to the carrier plate at the adhering table 14.

Further, whole surfaces of the wafers, which have been adhered on the carrier plate at the adhering table 14, are pressed at the press table 18, so that the wafers can be securely adhered to the carrier plate.

Figure 2:
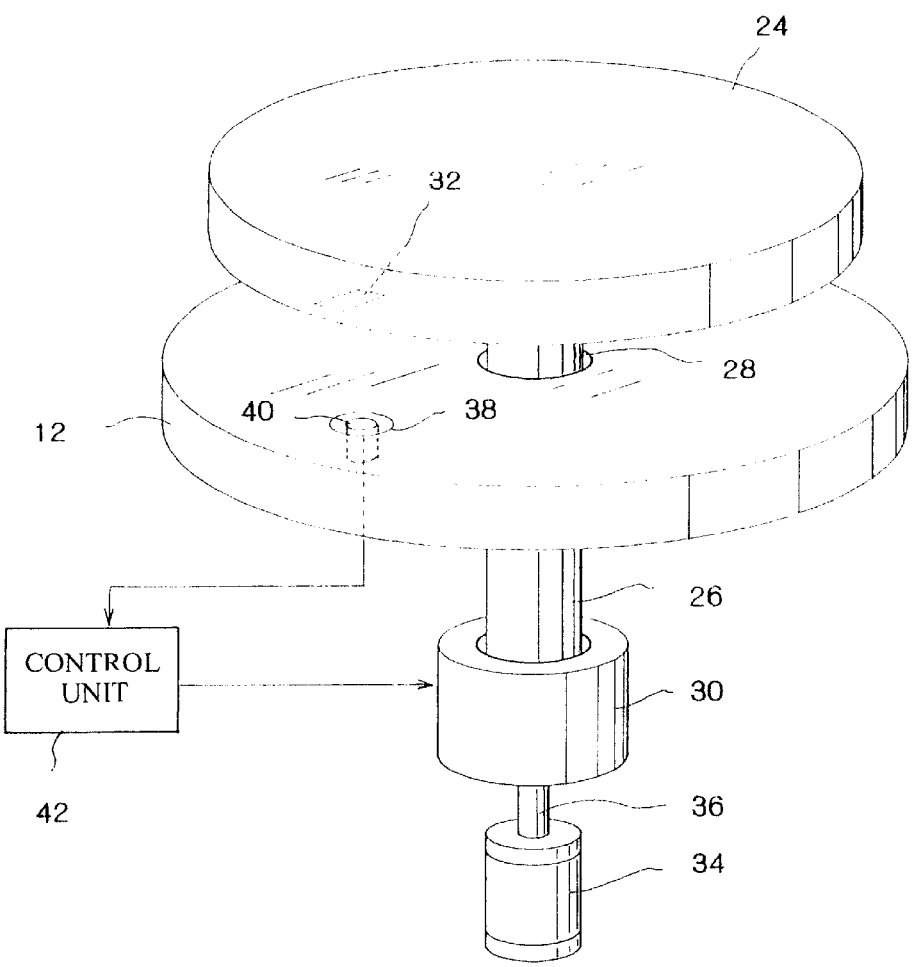
FIG. 2 is a perspective view of a second preheating table of the wafer adhering device shown in FIG. 1.

In the wafer adhering device shown in FIG. 1, the carrier plate is positioned at the second preheating table 12. FIG. 2 shows the state in which the carrier plate 24 is positioned at the second preheating table 12.

The second preheating table 12 includes a heater and is fixed at a prescribed position. The heating table 12 heats the carrier plate 24 until reaching predetermined temperature.

Sucking means (not shown) is provided to an upper end of a shaft 26, which is pierced through a through-hole 28 bored at a center of the heating table 12. The sucking means contacts a bottom face of the carrier plate 24 and holds the carrier plate 24 by air suction. On the other hand, a pulse motor 30, which acts as means for rotating the carrier plate 24, is connected to the lower end of the shaft 26.

Further, an upper end of a rod 36 of a cylinder unit 34 contacts a bottom face of the pulse motor 30 so as to vertically move the carrier plate 24 and the pulse motor 30.

As shown in FIG. 2, a concave part 38 is formed in an upper face of the heating table 12, on which the carrier plate 24 is mounted, and a photo sensor 40 is provided in the concave part 38. The photo sensor 40 detects a mark 32 provided in the bottom face of the career plate 24.

The mark 32 must be detected by the photo sensor 40 and have enough durability and chemical-resistance for long use. For example, the mark 32 is made of a ceramic whose color is different from that of the carrier plate 24. In the present embodiment, the black ceramic mark 32 is provided to the white carrier plate 24. Identification means, e.g., bar codes, symbols, may be added to the mark 32 so as to know history of the carrier plate 24.

Signals from the photo sensor 40 are sent to a control unit 42 (see FIG. 2), which includes a microprocessor and assembled in an operation panel of the wafer adhering device shown in FIG. 1. The control unit 42 controls the pulse motor 30 on the basis of the signals from the photo sensor 40.

The carrier plate 24 is positioned at the second preheating table 12 shown in FIG. 2 and conveyed to the wafer adhering table 14, by the conveyor unit 20, with keeping a posture of the carrier plate 24.

Figure 3A:
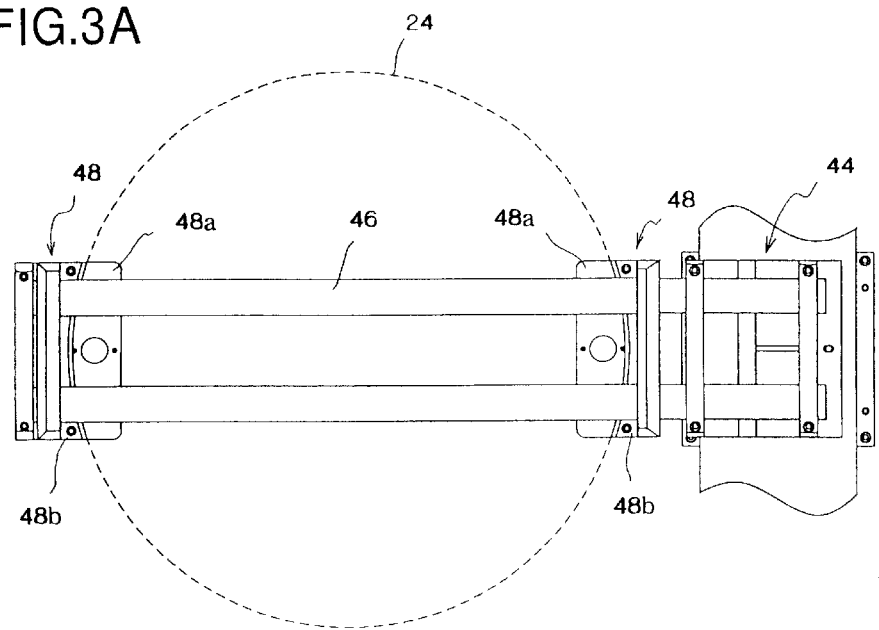
FIG. 3A is a partial front view of a conveyor unit for conveying a wafer.
Figure 3B:
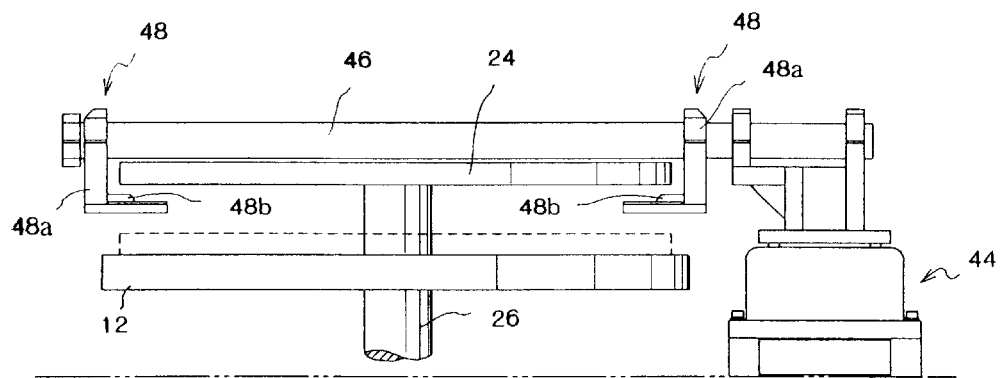
FIG. 3B is a side view of the conveyor unit shown in FIG. 3A.

The conveyor unit 20 will be explained with reference to FIGS. 3A and 3B. FIG. 3A is a partial front view of the conveyor unit 20; FIG. 3B is a side view thereof. The conveyor unit 20 includes a ball screw (not shown), which is rotated in a normal direction and a reverse direction by a motor (not shown) and which is arranged in the direction of conveying the carrier plate 24. A moving body 44 is screwed with the ball screw and can be moved, by the rotation of the ball screw, in the direction of conveying the carrier plate 24.

Arms 46 are extended, from the moving body 44, in the direction perpendicular to the moving direction of the moving body 44. A pair of holders 48 are provided to the arms 46. The holders 48 hold the carrier plate 24 and maintain the posture of the carrier plate 24, which has been defined at the heating table 12, while conveying to the adhering table 14.

L-shaped members 48a are respectively provided to the holders 48 and capable of moving along the arms 46. The L-shaped members 48a are capable of supporting edge portions of the carrier plate 24. Holding plates 48b are respectively provided to the L-shaped members 48a and capable of maintaining the posture of the carrier plate 24. One of the holding plates 48b is shown in FIGS. 4A and 4B.

Figure 4A:
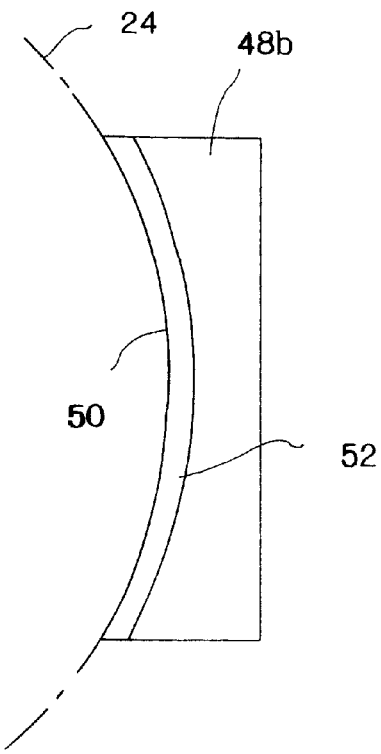
FIG. 4A is a front view of a holding plate of the conveyor unit.
Figure 4B:
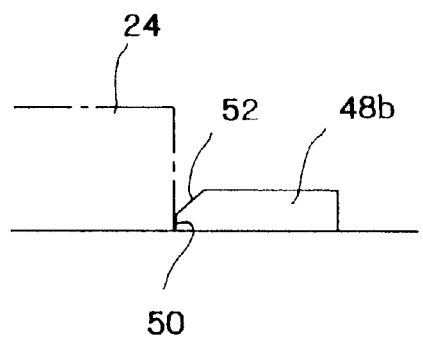
FIG. 4B is a side view of the holding plate.

FIG. 4A is a front view of the holding plate 48b; FIG. 4B is a side view thereof. As shown in FIG. 4A, an inner edge 50 of the holding plate 48b is curved along an outer edge of the carrier plate 24. Further, as clearly shown in FIG. 4B, a slope portion 52 is formed in an upper face of the holding plate 48b.

The curved inner edges 50 of the holding plates 48b are mutually faced.

Note that, the holders 48 can be fixed by driving screws (not shown) and moved by loosening the screws.

Figure 5:
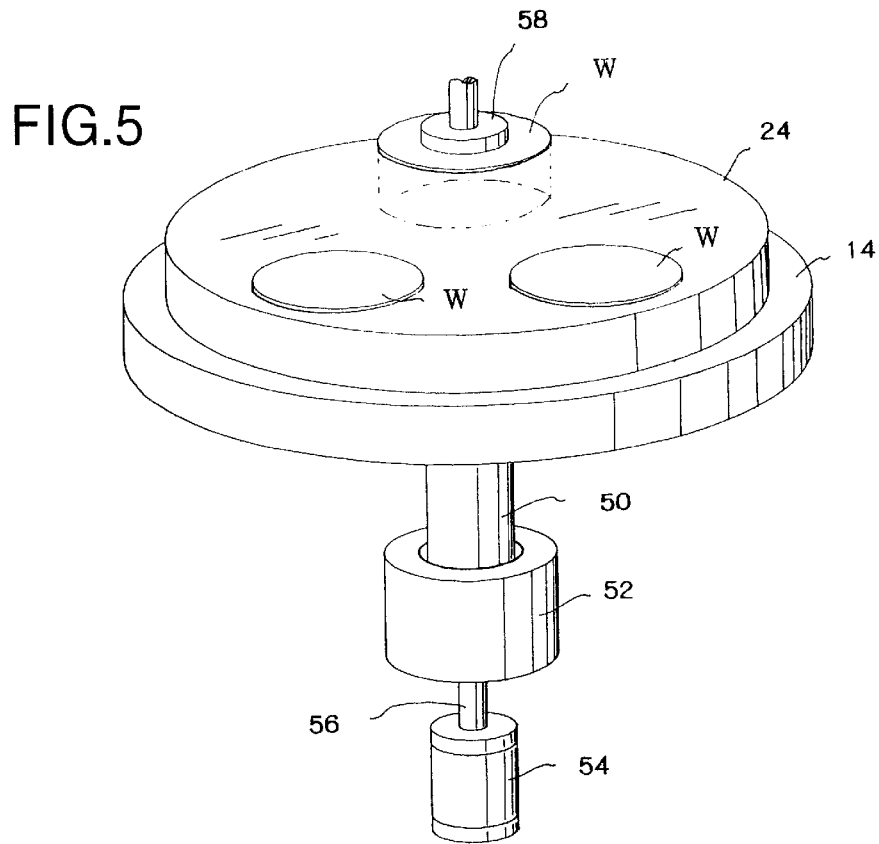
FIG. 5 is a perspective view of a wafer adhering table of the device shown in FIG. 1.
Figure 7:
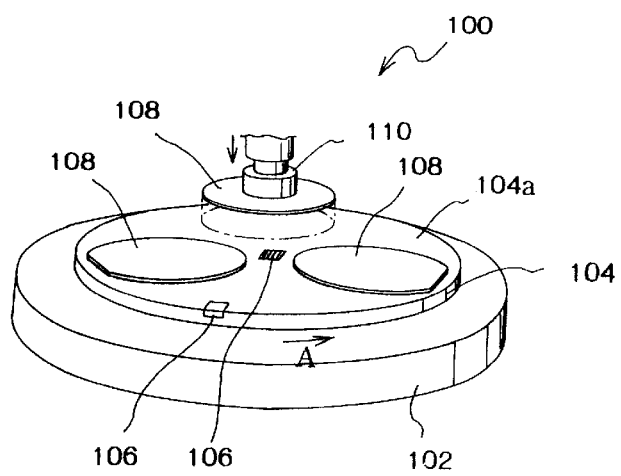
FIG. 7 is a perspective view of the conventional wafer adhering device.

The conveyor unit 20 conveys the carrier plate 24 to the adhering table 14 with keeping the posture of the carrier plate 24, which has been positioned, then the carrier plate 24 is mounted onto the adhering table 14 as shown in FIG. 5. In FIG. 5, the bottom face of the carrier plate 14, which is mounted on the adhering table 14, is held by sucking means (not shown), e.g., a vacuum pad, provided to an upper end of a shaft 50, which is pierced through a through-hole (not shown) bored a center of the adhering table. A lower end of the shaft 50 is connected to a pulse motor 52, which acts as means for rotating the carrier plate 24.

Further, a rod 56 of a cylinder unit 54 contacts a bottom face of the pulse motor 52 so as to vertically move the carrier plate 24 and the pulse motor 52.

With this structure, the carrier plate 24 can be moved away from the adhering table 14 by driving the cylinder unit 54, so that the carrier plate 24 can be easily rotated by the pulse motor 52.

The wafers "W" are mounted onto the carrier plate 24, which has been mounted on the adhering table 14, by a sucking member 58, which is capable of vertically moving.

The carrier plate 24, which is mounted on the adhering table 14 and on which the wafers "W" are mounted at prescribed positions, is conveyed to the press table 18 by the conveyor unit 22, whose conveying direction is perpendicular to that of the conveyor unit 20. The structure of the conveyor unit 22 is equal to that of the conveyor unit 20, so explanation will be omitted.

The press table 18 has a fluid bag (not shown) so as to securely adhere the wafers "W" at the prescribed positions in the carrier plate 24, which has been mounted on the press table 18. The fluid bag is made of an elastic material, e.g., rubber, and inner pressure of the bag is adjusted by pressure fluid, e.g., compressed air. The fluid bag can be vertically moved so as to press and securely adhere the wafers "W" on the carrier plate 24.

In the case of adhering the wafers "W" onto the carrier plate 24 by the wafer adhering device shown in FIGS. 1–4B, the carrier plate 24, which has been preheated until prescribed temperature, is mounted on the second preheating table 12 (see FIG. 2), then the carrier plate 24 is upwardly moved away from the heating table 12 by the cylinder unit 34 and rotated by the pulse motor 30. By rotating the carrier plate 24, the mark 32, which is provided to the bottom face of the carrier plate 24, passes the photo sensor 40. At that time, the photo sensor 40 of the preheating table 12 detects the mark 32 and sends the detecting signal to the control unit 42. Upon receiving the signal from the photo sensor 40, the control unit 42 sends a signal to the pulse motor 30 so as to stop the rotation thereof.

The carrier plate 24 stopped is correctly positioned with respect to the mark 32. Then, the carrier plate 24 is conveyed to the adhering table 14, by the conveyor unit 20 shown in FIGS. 3A and 3B, with keeping the posture of the carrier plate 24 which has been positioned.

When the carrier plate 24, which has been positioned at the second preheating table 12 (see FIG. 2), is conveyed to the adhering table 14 by the conveyor unit 20 (see FIGS. 3A and 3B), firstly positions of the holders 48 are manually adjusted so as to fit the inner curved edges 50 of the holding plates 48b with an outer circumferential face of the carrier plate 24.

Next, the position of the moving body 44 is adjusted by the ball screw (not shown) so as to correspond the L-shaped members 48a of the holders 48 to the bottom face of the carrier plate 24, which is located above the heating table 12.

Then, the carrier plate 24 is moved downward by retracting the rod 36 of the cylinder unit 34 (see FIG. 2), so that the carrier plate 24, which has been positioned, can be fitted with the inner curved edges 50 of the holding plates 48b.

After that, the moving body 44 is moved to the adhering table 14 by rotating the ball screw. While conveying to the adhering table 14, the outer circumferential face of the carrier plate 24 is clamped by the inner edges 50 of the holding plates 48b, so the posture of the carrier plate 24 can be maintained.

The carrier plate 24, which is conveyed to the adhering table 14 by the conveyor unit 20, is mounted onto the adhering table 14 as shown in FIG. 5. After the carrier plate 24 is upwardly moved away from the adhering table 14 by the cylinder unit 54, the pulse motor 52 rotates the carrier plate 24 until the prescribed position of the carrier plate 24, on which the wafer "W" will be mounted, corresponds to the sucking member 58.

When the prescribed position of the carrier plate 24, on which the wafer "W" will be mounted, corresponds to the sucking member 58, the rotation of the carrier plate 24 is stopped, then the carrier plate 24 is moved downward by the cylinder unit 54 so as to mount the carrier plate 24 onto the adhering table 14. And, the sucking member 58 is also moved downward so as to mount the wafer "W" onto the carrier plate 24. A bottom face of the wafer "W", which contacts the upper face of the carrier plate 24, is wholly uniformly covered with wax as adhesive. Other wafers "W" are also mounted onto prescribed positions of the carrier plate 24 by the same manner.

The carrier plate 24, on which the wafers "W" have been mounted, is conveyed to and mounted onto the press table 18 by the conveyor unit 20. The wafers "W" are securely adhered at the press table 18, then the carrier plate 24 is conveyed to an abrading section together with the wafers "W".

In the conventional methods disclosed in the Japanese Utility Model Gazette No. 2,562,044, in which the wafers are always adhered at same positions of the carrier plate, or Japanese Patent Gazette No. 11-320,393, in which the adhering positions of the wafers are shifted, the heating table 12 may be used. Since the photo sensor 40 of the heating table 12 sends the signal of detecting the mark 32 of the carrier plate 24 to the control unit 42, the control unit 42 can adjust timing of stopping the pulse motor 30 with respect to the detecting signal, so that the carrier plate 24 can be stopped at an optional rotational position.

Namely, in the wafer adhering device shown in FIGS. 1–4B, the carrier plate 24 can be positioned at desired rotational positions.

Further, the positioning the carrier plate 24 is executed in the preheating step whose required time is longer than other steps, so required time of the wafer adhering step of the present embodiment can be shorter than that of the conventional methods, in which positioning the carrier plate is executed in the wafer adhering step.

Even if the control unit 42 stops the pulse motor 30, the rotation of the carrier plate 24 is not rapidly stopped due to inertia. To precisely position the carrier plate 24 at the desired position, the carrier plate 24 must be stopped as soon as possible when the control unit 42 stops the pulse motor 30.

To solve the problem of the inertia, a wide mark may be employed as the mark 32 of the carrier plate 24, and the control unit 42 may control the pulse motor 30 as shown in a flow chart of FIG. 6. Namely, the control unit 42 turns on the pulse motor 30 (Step S1) so as to rotate the carrier plate 24 at prescribed rotational speed (Step S2).

After the rotational speed of the carrier plate 24 reaches the prescribed speed, the control unit 42 checks if the photo sensor 40 of the heating table 12 detects one end of the wide mark 32 of the carrier plate 24 or not (Step S3). If the photo sensor 40 detects the one end of the wide mark 32, the control unit 42 sends a control signal to the pulse motor 30 so as to make the rotational speed of the carrier plate 24 lower (Step S4). On the other hand, if the photo sensor 40 does not detect the one end of the wide mark 32 at the step S3, the control unit 42 continues the same task.

Successively, the control unit 42 checks if the photo sensor 40 detects the other end of the wide mark 32 of the carrier plate 24, which is rotated at the low speed, or not (Step S5). If the photo sensor 40 detects the other end of the wide mark 32, the control unit 42 turns off the pulse motor 30 so as to stop the rotation of the carrier plate 24 lower (Step S6). On the other hand, if the photo sensor 40 does not detect the other end of the wide mark 32 at the step S5, the control unit 42 continues the same task.

By stopping the rotation of the carrier plate 24 as described above, the carrier plate 24 can be stopped at the desired position and bad influences caused by the inertia can be prevented.

In the wafer adhering device shown in FIGS. 1–6, the carrier plate is positioned at the heating table 12, but the step of positioning the carrier plate 24 may be executed at a table having no heater as far as said is executed in the heating step.

The carrier plate may be positioned at the heating table 10 shown in FIG. 1.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims therefore intended to be embraced therein.

What is claimed is:

1. A method of adhering a wafer, comprising the steps of:
   heating a carrier plate;
   detecting a mark provided to a predetermined position of the carrier plate while rotating the carrier plate;
   positioning the carrier plate on the basis of a position of the detected marks, said steps of detecting and positioning being performed during said step of heating;
   conveying the carrier plate to a wafer adhering section with keeping a posture of the carrier plate which has been positioned in said positioning step; and
   adhering the wafer at a prescribed position of the carrier plate.

2. The method according to claim 1, wherein the mark is detected by a sensor provided to a heating table for heating the carrier plate.

3. A method of adhering a wafer, comprising the steps of:
   heating a carrier plate;
   detecting a mark provided to a predetermined position of the carrier plate rotating at predetermined rotational speed, the mark having a width defined by a distance between a first end and a second end;
   positioning the carrier plate on the basis of a position of the detected mark, wherein rotational speed of the carrier plate is made slower than the predetermined rotational speed when said first end of the mark is detected, and rotation of the carrier plate is stopped when said second end of the mark is detected;
   conveying the carrier plate to a wafer adhering section with keeping a posture of the carrier plate which has been positioned in said positioning step; and
   adhering the wafer at a prescribed position of the carrier plate.

4. A wafer adhering device for adhering a wafer, which has been heated at a heating section, to a carrier plate, comprising:
   means for detecting a mark provided to a predetermined position of the carrier plate while rotating the carrier elate which has been mounted on a table of the heating section;
   means for positioning the carrier plate on the basis of a position of the detected mark;
   means for conveying the carrier plate to a wafer adhering section with keeping a posture of the carrier plate which has been positioned in said positioning step; and
   means for mounting the wafer at a prescribed position of the carrier plate which has been conveyed to an adhering table.

5. The device according to claim 4, further comprising a sensor for detecting the mark, said sensor being provided to a fixed heating table.

6. A wafer adhering device for adhering a wafer, which has been heated at a heating section, to a carrier plate, comprising:
   means for detecting a mark provided to a predetermined position of the carrier plate rotating at predetermined rotational speed, the mark having a width defined by a distance between a first end and a second end;
   means for positioning the carrier plate on the basis of a position of the detected mark;

means for conveying the carrier plate to a wafer adhering section with keeping a posture of the carrier plate which has been positioned in said positioning step;

means for mounting the wafer at a prescribed position of the carrier plate which has been conveyed to an adhering table; and control means which makes rotational speed of the carrier plate slower than the predetermined rotational speed when said first end of the mark is detected, and stops rotation of the carrier plate when said second end of the mark is detected.

* * * * *

UNITED STATES PATENT AND TRADEMARK OFFICE
CERTIFICATE OF CORRECTION

| | |
|---|---|
| PATENT NO. | : 6,692,221 B2 |
| DATED | : February 27, 2004 |
| INVENTOR(S) | : Tetsuro Toya |

It is certified that error appears in the above-identified patent and that said Letters Patent is hereby corrected as shown below:

<u>Column 8,</u>
Line 46, change "elate" to -- plate --

Signed and Sealed this

Twelfth Day of October, 2004

JON W. DUDAS
*Director of the United States Patent and Trademark Office*